United States Patent
Sudo

(10) Patent No.: US 10,923,209 B2
(45) Date of Patent: Feb. 16, 2021

(54) SEMICONDUCTOR MEMORY DEVICE

(71) Applicant: Winbond Electronics Corp., Taichung (TW)

(72) Inventor: Naoaki Sudo, Yokohama (JP)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 15/930,104

(22) Filed: May 12, 2020

(65) Prior Publication Data

US 2020/0365224 A1    Nov. 19, 2020

(30) Foreign Application Priority Data

May 13, 2019 (JP) .............................. JP2019-090633

(51) Int. Cl.
    *G11C 29/12*    (2006.01)
    *G11C 29/44*    (2006.01)
    *G11C 29/50*    (2006.01)
    *G11C 29/14*    (2006.01)

(52) U.S. Cl.
    CPC ........ *G11C 29/12005* (2013.01); *G11C 29/14* (2013.01); *G11C 29/44* (2013.01); *G11C 29/50004* (2013.01)

(58) Field of Classification Search
    CPC .............. G11C 29/12005; G11C 29/14; G11C 29/50004; G11C 29/44
    See application file for complete search history.

(56) References Cited

U.S. PATENT DOCUMENTS

| | | | | |
|---|---|---|---|---|
| 8,059,465 B2* | 11/2011 | Isobe | ..................... | G11C 16/30 365/185.18 |
| 8,278,878 B2* | 10/2012 | Ishikawa | ................ | G01R 19/10 320/116 |
| 9,036,445 B1* | 5/2015 | Shin | ........................ | G11C 17/18 365/229 |
| 2002/0004867 A1 | 1/2002 | Farmwald et al. | | |
| 2004/0150463 A1* | 8/2004 | Senda | ................... | H02M 3/073 327/534 |

(Continued)

FOREIGN PATENT DOCUMENTS

| | | |
|---|---|---|
| CN | 104835536 A | 8/2015 |
| JP | 6494139 B1 | 4/2019 |
| TW | 303465 B | 4/1997 |

*Primary Examiner* — Tri M Hoang
(74) *Attorney, Agent, or Firm* — Birch, Stewart, Kolasch & Birch, LLP

(57) ABSTRACT

A semiconductor memory device that can reduce power consumption and precisely perform a power-down operation while a testing operation is underway is provided. A flash memory of the invention has a low-power voltage-detection circuit, a high-precision voltage-detection circuit, and a controller. The low-power voltage-detection circuit detects the supply voltage falling to a constant voltage. The high-precision voltage-detection circuit detects the supply voltage falling to the constant voltage. The controller selects the high-precision voltage-detection circuit when the internal circuit is being tested, and it selects the low-power voltage-detection circuit when the internal circuit is not undergoing a test. The controller responds to the detection result from the low-power voltage-detection circuit or the high-precision voltage-detection circuit by performing a power-down operation.

9 Claims, 5 Drawing Sheets

(56) References Cited

U.S. PATENT DOCUMENTS

| | | | |
|---|---|---|---|
| 2006/0250875 A1* | 11/2006 | Hijikata | G11C 5/143 365/226 |
| 2012/0226929 A1* | 9/2012 | Lee | G06F 11/3055 713/340 |
| 2017/0229860 A1* | 8/2017 | Vakilian | H02J 50/80 |
| 2019/0041890 A1* | 2/2019 | Chen | H03F 3/189 |

* cited by examiner

SEMICONDUCTOR MEMORY DEVICE

CROSS REFERENCE TO RELATED APPLICATIONS

The present application is based on, and claims priority from, Japan Application Serial Number 2019-090633, filed on May 13, 2019, the disclosure of which is hereby incorporated by reference herein in its entirety.

BACKGROUND

Field of the Invention

The present invention relates to a semiconductor memory device such as a flash memory, and more particularly, to power-down detection during a testing operation.

Description of the Related Art

NAND-type flash memory uses a fuse cell in order to store voltage settings for reading, programming, erasing, etc., or to store setting information such as user options. The fuse cell may be set to a memory area that can't be accessed by the user in the memory array, for example. When the power is on, the flash memory reads the setting information from the fuse cell as a power-up operation, and loads the setting information to the internal register. After the power-up operation is complete, the controller controls every operation based on the setting information which is kept in the internal register. (Patent Document 1)

PRIOR TECHNICAL DOCUMENT

Patent Document

[Patent Document 1] JP 6494139 B1

BRIEF SUMMARY

Problem to be Solved by the Invention

The power-up detecting operation when the power of flash memory is on, and the power-down detecting operation when the power of flash memory is off, are described with reference to FIG. 1, which illustrates the external supply of voltage over time.

The power-up detecting part, which may be in a flash memory provided with a voltage of 3.0V (an operating guarantee voltage range is from 2.7V to 3.3V) detects a power-up voltage level V_PU of about 2.2V, which acts as the voltage used for starting a power-up operation while the power is on. The power-up detecting part initially uses a detection circuit having a relatively low accuracy to detect that the supply voltage has reached a constant voltage. Then, a detection circuit having a relatively high accuracy is used to detect that the supply voltage has reached the power-up voltage level V_PU. The high-accuracy detection circuit comprises a reference voltage generating circuit, or a comparing circuit for comparing the reference voltage with the supply voltage. After detecting the power-up voltage level V_PU, a power-up sequence is performed, the internal circuit is initialized (reset), and the setting information read from the fuse cell of the memory cell array is set in the register. Thereafter, when the supply voltage rises to the operating guarantee voltage, normal operation begins.

FIG. 2 shows a conventional power-down detecting part. After the power-down detecting part 10 detects that the supply voltage Vcc has fallen to the power-down voltage level V_PD, it outputs a reset signal to the internal circuit 20 such as a CPU or a logic circuit. For example, when the external power supply capability is low, or a peak current larger than the operating current of the internal circuit 20 occurs, the supply voltage Vcc falls to the power-down voltage level V_PD. After receiving the reset signal from the power-down detecting part 10, the internal circuit 20 performs a power-down operation, stops the operation of the charge pump circuit of the internal circuit 20, and resets the CPU or the logic circuit, etc.

The power-down voltage level V_PD is lower than the power-up voltage level V_PU (if not, the power-down operation will be performed after the power-up operation, and the flash memory cannot operate). Moreover, both the power-down voltage level V_PD and the power-up voltage level V_PU are set to be higher than the operating voltage Vt (for example, the threshold of the PMOS and the threshold of the NMOS) of the CMOS in the internal circuit (if not, the power-up operation and the power-down operation cannot operate correctly).

In addition, when the flash memory is in the standby state, the current consumption which can be tolerated in this state is defined by the specification. Due to such limitations, the power-down detecting part 10 is constructed not to exceed the tolerable current consumption in the standby state, and the operating current is minimized. For example, as shown in FIG. 3, the power-down detecting part 10 is configured with a simple circuit using a resistor divider and an inverter, and outputs a detecting signal Vdet in H level when detecting the power-down voltage level V_PD.

Since the power-down detecting part 10 does not comprise the reference voltage generating circuit or the comparing circuit as the power-up detecting part, power consumption can be reduced, but the detection accuracy is worse than the power-up detecting part. Therefore, as shown in FIG. 1, the variation of the detecting range H2 of the power-down detecting part 10 is larger than the detecting range H1 of the power-up detecting part.

Using the power-down detecting part 10, since the variation of the detecting range H2 is large, there is always a problem wherein the power-down voltage level V_PD cannot be detected accurately. If the flash memory is in the standby state, there is no particular influence even though there is some deviation in the detecting range of the power-down voltage level V_PD; however, if the power-down voltage level V_PD cannot be detected accurately in the internal circuit testing, it might cause severe problems for the flash memory. When testing a memory cell array or its peripheral circuit, parallel measurements are often performed. Therefore, in an environment where the supply voltage may drop easily during testing, the supply voltage may fall below the power-down voltage level V_PD, making it impossible to start the power-down operation. Then, due to the wrong operation being conducted, a high voltage may be applied to an unexpected circuit, causing the circuit to malfunction, or causing the wrong data to be programmed into the memory cell. As a result, the reliability of the test will suffer.

The object of this invention is to solve the conventional problems described above, and to provide a semiconductor memory device that can reduce power consumption and perform a power-down operation precisely, even while conducting a test.

Device to Solve the Problem

A semiconductor memory device according to this invention comprises a first detection circuit, a second detection circuit, a selecting device, and a performing device. The first detection circuit detects the supply voltage falling to a constant voltage. The second detection circuit has a higher detection accuracy than the first detection circuit. The second detection circuit can detect the supply voltage falling to the constant voltage. The selecting device selects the second detection circuit when the internal circuit is in a testing state. The selecting device selects the first detection circuit when the internal circuit is not in a testing state. The performing device responds to the detection result of the first detection circuit or the second detection circuit by performing a power-down operation.

Effect of the Invention

According to this invention, the selecting device selects the second detection circuit while the internal circuit is in the testing state, selecting the first detection circuit while the internal circuit is not in the testing state, and the performing device responds to the detection result from the first detection circuit or the second detection circuit, and performs a power-down operation. Therefore, the semiconductor memory device can reduce power consumption and precisely perform a power-down operation while in the testing operation as well.

DETAILED DESCRIPTION

Next, embodiments of this invention will be described in detail with reference to the drawings. Preferably, the semiconductor memory device of this invention is a non-volatile memory, such as a NAND type or a NOR type flash memory, a resistive random access memory, and a magnetoresistive random access memory. In the following description, the NAND type flash memory is exemplified.

Embodiments

Figure 4:
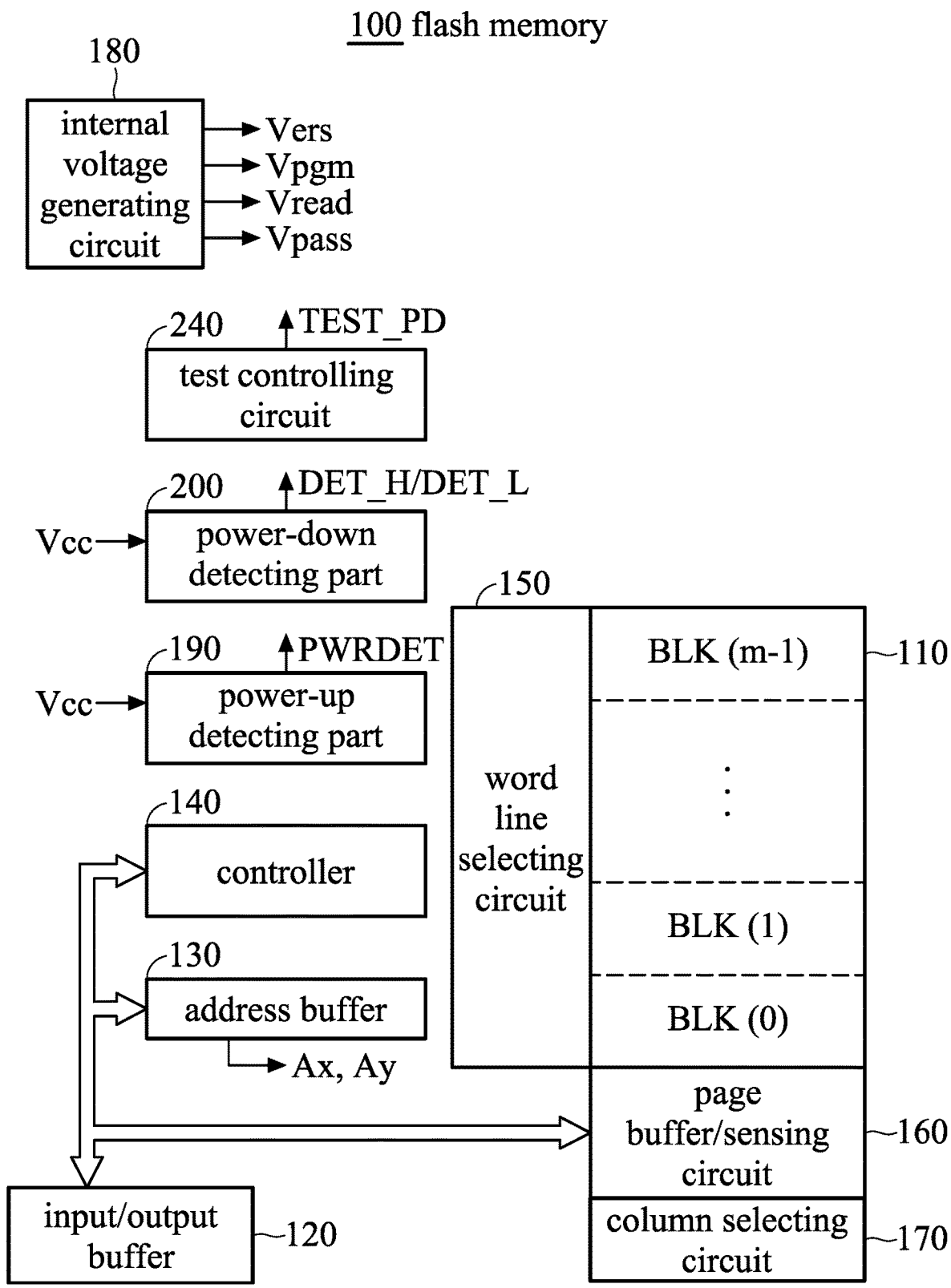
FIG. 4 shows a block diagram of the internal configuration of the flash memory according to the embodiment of this invention.

FIG. 4 shows a schematic configuration of the flash memory according to the embodiment of this invention. The flash memory 100 of this invention comprises a memory cell array 110, an input/output buffer 120, an address register 130, a controller 140, a word line selecting circuit 150, a page buffer/sensing circuit 160, a column selecting circuit 170, an internal voltage generating circuit 180, a power-up detecting part 190, a power-down detecting part 200, and a test controlling circuit 240. The memory cell array 110 has a plurality of memory cells arranged in a matrix. The input/output buffer 120 is connected to an external input/output node I/O. The address register 130 receives address data from the input/output buffer 120. The controller 140 receives command data from the input/output buffer 120 and controls every part of the flash memory 100. The word line selecting circuit 150 receives row address information Ax from the address register 130. The word line selecting circuit 150 decodes the row address information Ax and selects the block and the word line based on the decoding result. The page buffer/sensing circuit 160 keeps the data read from the page selected by the word line selecting circuit 150. The page buffer/sensing circuit 160 keeps the input data which is supposed to be programmed to the selected page. The column selecting circuit 170 receives column address information Ay from the address register 130. The column selecting circuit 170 decodes the column address information Ay and selects the data of the column address in the page buffer/sensing circuit 160 based on the decoding result. The internal voltage generating circuit 180 generates every kind of essential voltage: for reading, programming, erasing data, etc. (programming voltage Vpgm, passing voltage Vpass, reading pass voltage Vread, erasing voltage Vers, etc.). The power-up detecting part 190 monitors the supply voltage Vcc supplied by the external node while the power is on. The power-up detecting part 190 detects the power-up voltage level V_PU and outputs a power-up detecting signal PWR-DET. The power-down detecting part 200 monitors the supply voltage Vcc and detects the power-down voltage level V_PD. The power-down detecting part 200 outputs a power-down detecting signal DET_H/DET_L. The test controlling circuit 240 runs tests on the internal circuit, including the memory cell array and its peripheral circuit.

The memory cell array 110 is provided with m blocks BLK(0), BLK(1), . . . , BLK(m−1) which are arranged in the column direction. A plurality of NAND strings are formed in one block, and each NAND string has a plurality of memory cells connected in series. The NAND strings may be formed two-dimensionally on the surface of the substrate or three-dimensionally on the surface of the substrate. In addition, the memory cell may be a SLC (single level cell) type that memorizes 1 bit (two-value data), or it may be an MLC (multi level cell) type that memorizes multiple bits. One NAND string is configured by connecting a plurality of memory cells (for example, 64), a bit line side selecting transistor, and a source line side selecting transistor in series. The drain of the bit line side selecting transistor is connected to one corresponding bit line GBL; and the source of the source line side selecting transistor is connected to the common source line SL.

In the reading operation, some positive voltage is applied to the bit line, some voltage (such as 0V) is applied to the selected word line, the passing voltage Vpass (such as 4.5V)

is applied to the unselected word line, the positive voltage (such as 4.5V) is applied to the selected gate lines SGD, SGS to turn on the bit line side selecting transistor and the source line side selecting transistor of the NAND string, and 0V is applied to the common source line. In the programming operation, the high programming voltage Vpgm (15~20V) is applied to the selected word line, the intermediate electric potential (such as 10V) is applied to the unselected word line to turn on, the bit line side selecting transistor, and turn off the source line side selecting transistor, and thereby providing the electric potential corresponding to the "0" or "1" to the bit line. In the erasing operation, 0V is applied to the selected word line in the block, the high voltage (such as 20V) is applied to the P-well to pull out, the electron in the floating gate from the substrate, whereby erase the data by blocks.

After detecting that the supply voltage Vcc supplied to the flash memory 100 while the power is on is reached the power-up voltage level V_PU, the power-up detecting part 190 outputs the power-up detecting signal PWRDET to the controller 140. The controller 140 comprises such as the CPU or the ROM/RAM, etc. The ROM/RAM stores the code program such as the command or the data for performing the power-up operation, the power-down operation, the reading operation, the programming operation, and the erasing operation. After receiving the power-up detecting signal PWRDET, the controller 140 responds to the power-up detecting signal PWRDET and performs a power-up operation according to the code read from the ROM/RAM. In the power-up operation, an internal circuit including the controller 140 may be reset, or the fuse cell of the memory cell array 110 is read.

After detecting that the supply voltage Vcc is fallen to the power-down voltage level V_PD, the power-down detecting part 200 outputs the power-down detecting signal DET_L or DET_H to the controller 140 according to the operation state of the flash memory 100. After receiving the power-down detecting signal DET_L/DET_H, the controller 140 responses the power-down detecting signal DET_L/DET_H, and perform the power-down operation according to the code read from the ROM/RAM. In the power-down operation, such as the reset of the internal circuit including the controller 140, or the stopping of the charge pump circuit is performed.

The test controlling circuit 240 is not particularly limited in its configuration, and may be, for example, a built-in self test circuit (hereinafter referred to as BIST circuit). The BIST circuit is one of the design techniques for simplifying the test of the memory or the logic. The BIST circuit can includes functions for self-testing the internal circuit comprising the memory cell array 110 or its peripheral circuit, and can perform the test of the internal circuit at the wafer level, the chip level, or the package level. In addition, the BIST circuit may include such as a circuit that generates a test pattern, a circuit that compares the testing result with an expected value, or a circuit that outputs "pass" or "fail" as a comparing result.

The test controlling circuit 240, for example, responds to the test signal which has been applied to the test node, and runs a test on the internal circuit; or it responds to an external test command by running a test on the internal circuit. While testing the internal circuit, the test controlling circuit 240 outputs a test signal TEST_PD in H level, to represent that it is under testing.

Figure 1:
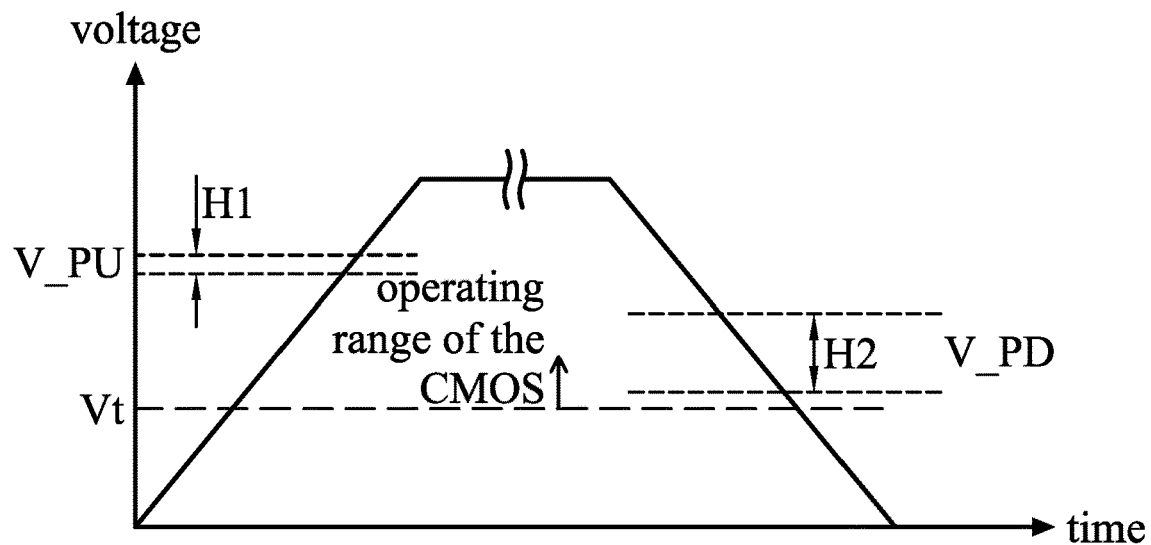
FIG. 1 is a schematic view illustrating the power-up detecting operation and the power-down detecting operation of the flash memory.
Figure 2:
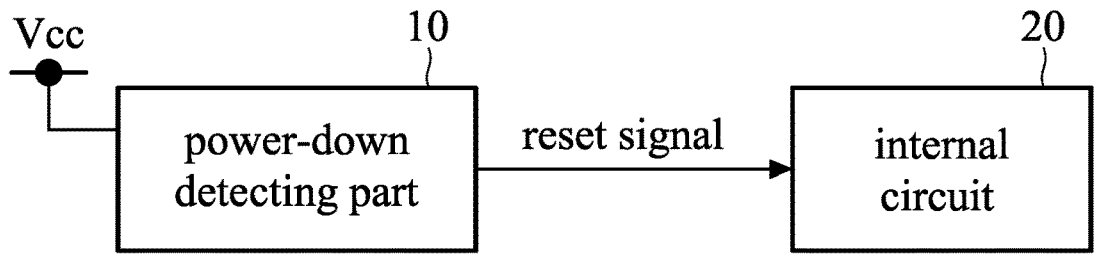
FIG. 2 shows a conventional power-down detecting part.
Figure 3:
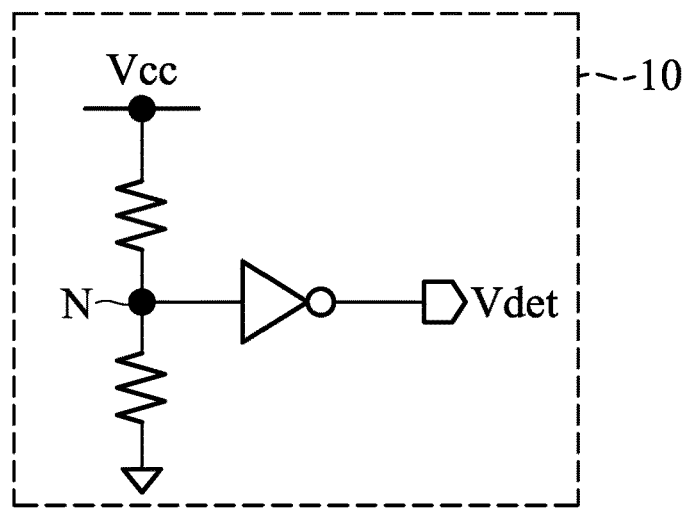
FIG. 3 shows an example of the configuration of the conventional power-down detecting part.
Figure 5:
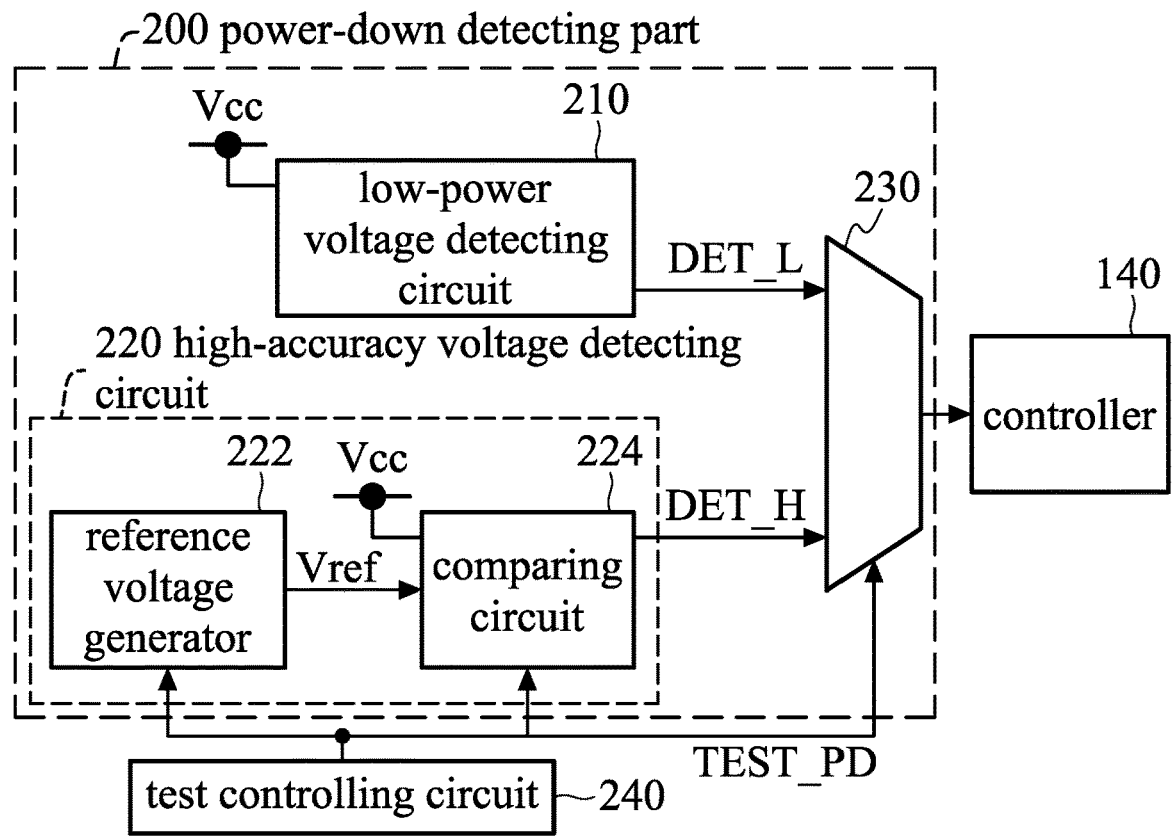
FIG. 5 shows a configuration of the power-down detecting part according to the embodiment of this invention.

FIG. 5 shows an internal configuration of the power-down detecting part 200 according to this embodiment. As shown in this figure, the power-down detecting part 200 comprises: a low-power voltage-detection circuit 210, a high-accuracy voltage-detection circuit 220, and a selector 230. The low-power voltage-detection circuit 210 is a relatively simple circuit, and is configured with a circuit which can even reduce power consumption, for example, as shown in FIG. 3, is configured with a detection circuit 10 including a resistor and a inverter. The detection circuit 10 monitors the supply voltage Vcc constantly, and the value of the detection circuit 10 is selected such that when the detecting node N has fallen to the power-down voltage level V_PD, the voltage of the detecting node N becomes below the threshold of the inverter. In this way, after detecting that the supply voltage Vcc falls to the power-down voltage level V_PD, the low-power voltage-detection circuit 210 outputs the detecting signal DET_L in H level to the selector 230 to represent the detection result (corresponding to the detecting signal Vdet).

The high-accuracy voltage-detection circuit 220 comprises: a reference voltage generator 222, generating the reference voltage Vref; and a comparing circuit 224, comparing the reference voltage Vref generated by the reference voltage generator 222 with the supply voltage Vcc. The reference voltage Vref is set to be the power-down voltage level V_PD. After the supply voltage Vcc falls to the power-down voltage level V_PD, the comparing circuit 224 outputs the detecting signal DET_H in H level to the selector 230 to represent that case.

Figure 6:
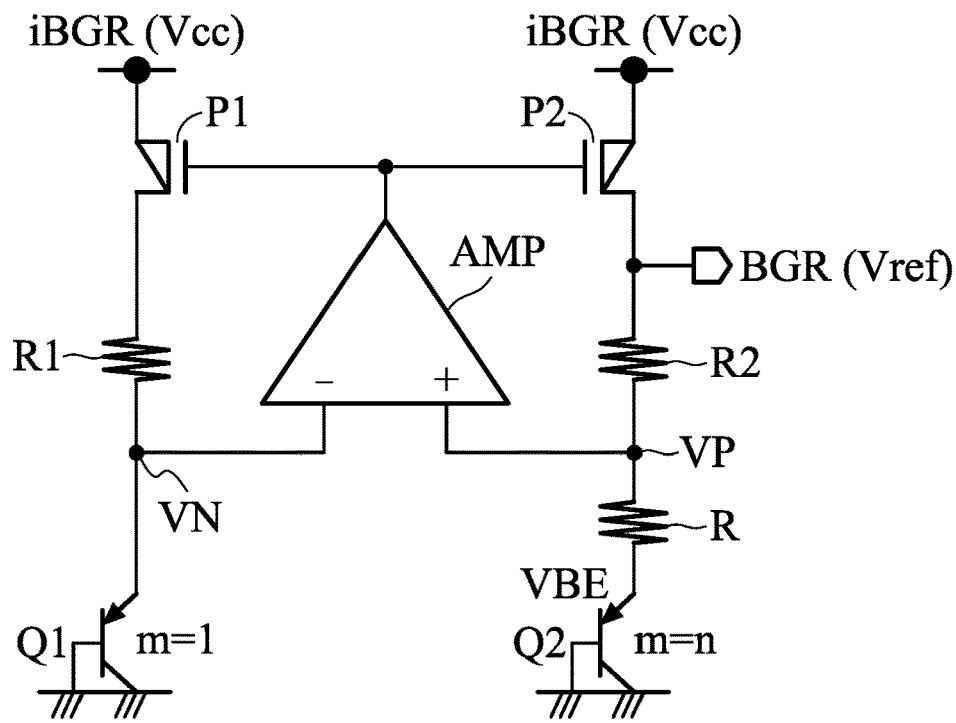
FIG. 6 shows an example of the reference voltage generating circuit according to the embodiment of this invention.

The reference voltage generating circuit 222 is not particularly limited in its configuration, and for example, may be implemented by a band gap reference circuit, which merely relies on the variation of the power supply voltage or the operating temperature. FIG. 6 shows a general band gap reference circuit. As shown in this figure, the band gap reference circuit comprises: a first current path and a second current path, between the power supply voltage Vcc (iBGR) and GND; a PMOS transistor P1, a resistor R1, and a bipolar transistor Q1, connected in series in the first current path; a PMOS transistor P2, resistors R2, R, and a bipolar transistor Q2, connected in series in the second current path; and a differential amplifying circuit AMP, whose inverting input node (−) connected with a common node VN of the resistor R1 and the transistor Q1, whose non-inverting input node (+) connected with a common node VP of the resistors R2 and R, and whose output node connected together with the gate of the PMOS transistors P1 and P2. The differential amplifying circuit AMP adjusts the output voltage, such that the forward voltage of the transistor Q1, is equal to the sum of the forward voltage of the transistor Q2 and the voltage generated by the resistor R, and outputs the reference voltage Vref from an output node BGR.

Figure 7:
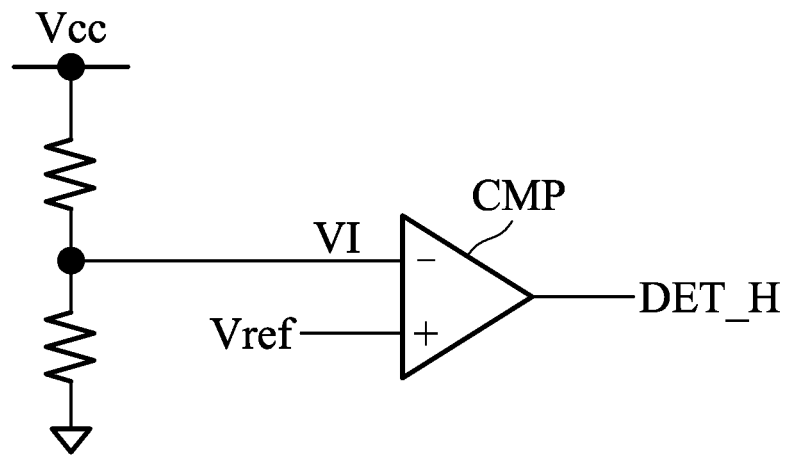
FIG. 7 shows an example of the high-accuracy voltage-detection circuit according to the embodiment of this invention.

The comparing circuit 224 is not particularly limited in its configuration. For example, FIG. 7 shows that the comparing circuit 224 comprises a comparator CMP, which is used for comparing an internal voltage VI generated by the power supply voltage Vcc to the reference voltage Vref. The reference voltage Vref is equal to the power-down voltage level V_PD. When VI>Vref, the comparator CMP outputs the detecting signal DET_H in L level; when Vref≥VI, the comparator CMP outputs the detecting signal DET_H in H level.

The operations of the reference voltage generator 222 and the comparing circuit 224 are determined by the testing signal TEST_PD from the test controlling circuit 240. For example, when the testing signal TEST_PD is in H level, it enables the reference voltage generator 222 and the comparing circuit 224; when the testing signal TEST_PD is in L level, it disables the reference voltage generator 222 and the comparing circuit 224.

The selector 230 receives the detecting signal DET_L from the low-power voltage-detection circuit 210 and the detecting signal DET_H from the high-accuracy voltage-detection circuit 220, selects one of the signals based on the testing signal TEST_PD from the test controlling circuit 240, and outputs the selected detecting signal to the controller 140. For example, when the testing signal TEST_PD is in H level, the testing signal DET_H of the high-accuracy voltage-detection circuit 220 is selected; when the testing signal TEST_PD is in L level, the testing signal DET_L of the low-power voltage-detection circuit 210 is selected. When the testing signals DET_L or DET_H indicates the power-down voltage level V_PD, the controller 140 responds to the testing signals DET_L or DET_H, and performs an operation such as resetting the internal circuit.

Next, the operation of the power-down detecting part 200 according to this embodiment will be described. While the testing of the internal circuit (the memory cell array or the peripheral circuit) is being performed by the test controlling circuit 240, the power-down detecting part 200 responds to the testing signal TEST_PD and the high-accuracy voltage-detection circuit 220 operates, and the selector 230 outputs the detecting signal DET_H of the high-accuracy voltage-detection circuit 220 to the controller 140. That is, while in the testing state, both the low-power voltage-detection circuit 210 and the high-accuracy voltage-detection circuit 220 will operate, and the detecting signal DET_H of the high-accuracy voltage-detection circuit 220 is provided to the controller 140 by the selector 230.

On the other hand, while the testing of the internal circuit is not being performed by the test controlling circuit 240, the power-down detecting part 200 responds to the testing signal TEST_PD and the high-accuracy voltage-detection circuit 220 stops operating, and the selector 230 outputs the detecting signal DET_L of the low-power voltage-detection circuit 210 to the controller 140. That is, in the non-testing state, only the low-power voltage-detection circuit 210 will operate, and the detecting signal DET_L of the low-power voltage-detection circuit 210 is provided to the controller 140 by the selector 230.

Figure 8:
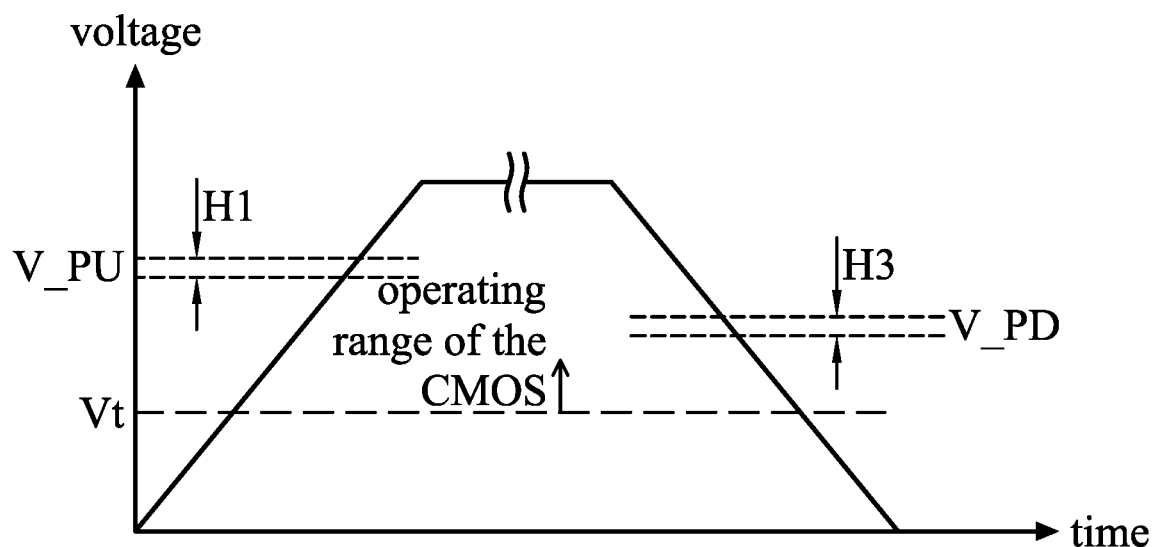
FIG. 8 shows a variation of the detecting range of the power-down detecting part in the testing state according to the embodiment of this invention.

FIG. 8 shows the detecting range H3 of the power-down voltage level V_PD while in the testing state, according to this embodiment. As described above, when the test is performed using the high-accuracy voltage-detection circuit 220 to detect the power-down voltage level V_PD, the detection accuracy is higher than when the low-power voltage-detection circuit 210 is used, so the variation (i.e. the detecting range H3) can be smaller. In the testing state, the internal circuit is operating, and due to parallel measurements for example, the supply voltage weakens. By precisely detecting the power-down voltage level V_PD during testing, the internal circuit may be prevented from operating at a voltage that is lower than the power-down voltage level V_PD. Therefore, circuit failure may be prevented, improving reliability. On the other hand, when the internal circuit is not tested, the high-accuracy voltage-detection circuit 220 stops operating, and only the low-power voltage-detection circuit 210 is allowed to operate.

Here, during the testing of the power-up voltage level V_PU, the power-up detecting part 190 must be very accurate. Therefore, the power-up detecting part 190 also uses the high-accuracy voltage-detection circuit, and the high-accuracy voltage-detection circuit uses the reference voltage generator or the comparing circuit. Accordingly, the high-accuracy voltage-detection circuit 220 of the power-down detecting part 200 can also use the high-accuracy voltage-detection circuit of the power-up detecting part 190. In such cases, after the power-up sequence is over, the detecting level of the high-accuracy voltage-detection circuit changes from the power-up voltage level V_PU to the power-down voltage level V_PD.

In addition, in the embodiment described above, the high-accuracy voltage-detection circuit 220 may be enabled or disabled in response to the testing signal TEST_PD from the test controlling circuit 240, but this is just one example. In short, the high-accuracy voltage-detection circuit 220 can be enabled or disabled based on information indicating that the test is being performed. For example, the high-accuracy voltage-detection circuit 220 can be enabled or disabled in response to a signal from the test pad or the external node. In addition, the high-accuracy voltage-detection circuit 220 can be enabled or disabled in response to an external test command. This is the same for the selecting operation of the selector 230.

Next, the other embodiment according to this invention will be described. In the embodiment described above, an example of the high-accuracy voltage-detection circuit 220 using the reference voltage Vref generated by the reference voltage generator 222 is shown. In this embodiment, the high-accuracy voltage-detection circuit 220 uses the reference voltage Vref input via the test pad.

Figure 9:
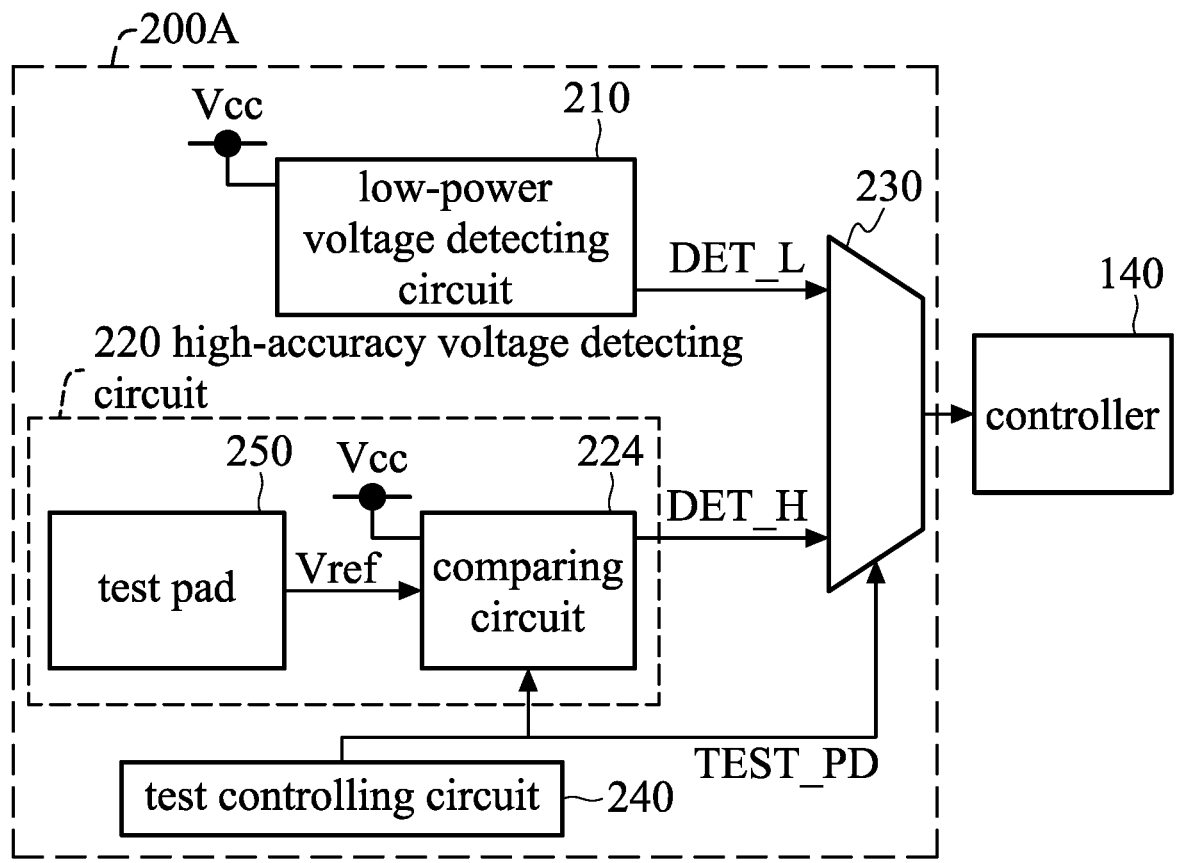
FIG. 9 shows a configuration of the power-down detecting part according to other embodiment of this invention.
Figure 10:
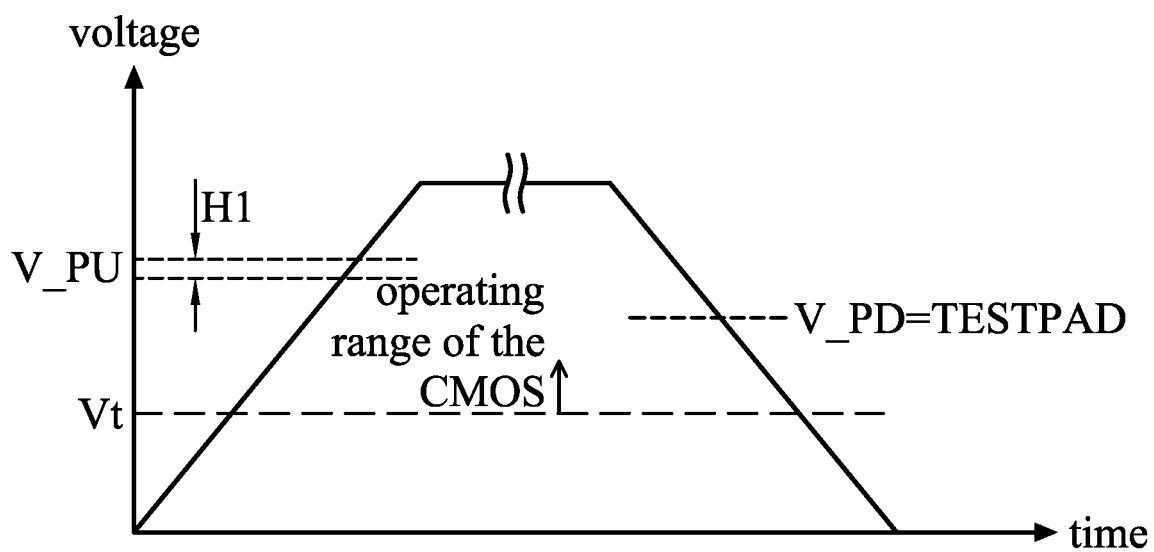
FIG. 10 illustrates a variation of the detecting range of the power-down detecting part in the testing state according to other embodiment of this invention.

FIG. 9 shows the configuration of the power-down detecting part 200A according to this embodiment. As shown in the figure, the test pad 250, for example, is a special pad which is not connected to the external node. During testing at the wafer level or the chip level, a reference voltage Vref is applied to the test pad 250 by probing. The reference voltage Vref is, for example, the power-down voltage level V_PD. FIG. 10 shows the detecting range of the power-down voltage level V_PD in testing according to this embodiment, and the variation of the detecting range can actually be neglected. This is done so that the comparing circuit 224 can use the reference voltage Vref input from the test pad 250 to accurately detect whether or not the supply voltage Vcc has fallen to the power-down voltage level V_PD.

In the embodiment described above, an example of inputting the reference voltage Vref from the test pad 250 is shown, but this is just one example. The reference voltage Vref may also be input from the external node with an electrical connection to the test pad 250. The external node may be a node that is not used in testing. Moreover, in the embodiment described above, the NAND flash memory is shown as an example, but this invention is not so limited, and power-down detection may be applied to other non-volatile memories.

The preferred embodiments of this invention are described in detail; however, this invention is not limited to the specific embodiments, and various modifications or changes can be made within the scope of the object of the invention written in the claims.

What is claimed is:
1. A semiconductor memory device comprising:
   a first detection circuit, detecting a supply voltage falling to a constant voltage;
   a second detection circuit, having higher detection accuracy than that of the first detection circuit, and detecting the supply voltage falling to the constant voltage;
   a selecting device, selecting the second detection circuit while an internal circuit is in a testing state, and selecting the first detection circuit while the internal circuit is not in the testing state; and a performing device, responding to a detection result from the first detection circuit or the second detection circuit, and performing a power-down operation.

2. The semiconductor memory device of claim 1, wherein the second detection circuit comprises:
- a reference voltage generating circuit, generating a reference voltage, and
- a comparing circuit, comparing the reference voltage with a power supply voltage; and wherein the first detection circuit does not comprise the reference voltage generating circuit.

3. The semiconductor memory device of claim 1, wherein the internal circuit comprises a testing circuit; and wherein the selecting device selects the second detection circuit while the testing circuit is performing a test, and selects the first detection circuit while the testing circuit is not performing a test.

4. The semiconductor memory device of claim 3, wherein the selecting device selects the first detection circuit or the second detection circuit based on a test signal which is output by the testing circuit.

5. The semiconductor memory device of claim 1, wherein the selecting device selects the second detection circuit when a command for starting a test is input from exterior.

6. The semiconductor memory device of claim 1, wherein the selecting means selects the second detection circuit when a signal is input to a test pad.

7. The semiconductor memory device of claim 1, wherein the second detection circuit uses a reference voltage which is input from a test pad to detect that the supply voltage has fallen to the constant voltage.

8. The semiconductor memory device of claim 3, wherein the testing circuit performs a test of a memory cell array or a peripheral circuit of the memory cell array.

9. The semiconductor memory device of claim 1, wherein a voltage level detected by the first detection circuit and a voltage level detected by the second detection circuit is lower than a voltage level detected by a power-up detection circuit, and is higher than a voltage level at which a complementary metal oxide semiconductor can operate.

* * * * *